United States Patent [19]
Sloan et al.

[11] Patent Number: 5,383,194
[45] Date of Patent: Jan. 17, 1995

[54] INTEGRATED LOGIC CIRCUIT INCLUDING IMPEDANCE FAULT DETECTION

[75] Inventors: Mark D. Sloan, Princeton, Ind.; William A. Rogers; Srihari Shoroff, both of Austin, Tex.

[73] Assignee: University of Texas System Board of Regents, Austin, Tex.

[21] Appl. No.: 973,069

[22] Filed: Nov. 6, 1992

[51] Int. Cl.$^6$ ............................................. G11C 29/00
[52] U.S. Cl. .................................. 371/22.1; 371/22.5; 371/22.6
[58] Field of Search ...................... 371/22.1, 22.5, 22.6

[56] References Cited

U.S. PATENT DOCUMENTS

| | | | |
|---|---|---|---|
| 4,638,246 | 1/1987 | Blank et al. | 324/73 R |
| 4,739,388 | 4/1988 | Packeiser et al. | 357/68 |
| 4,743,841 | 5/1988 | Takeuchi | 324/73 |
| 4,752,729 | 6/1988 | Jackson et al. | 371/15 |
| 4,789,825 | 12/1988 | Carelli et al. | 324/158 |
| 4,965,800 | 10/1990 | Farnbach | 371/22.1 |
| 4,970,454 | 11/1990 | Stambaugh et al. | 324/73.1 |
| 5,019,772 | 5/1991 | Dreibelbis et al. | 324/158 |
| 5,032,786 | 7/1991 | Kimura | 324/158 |
| 5,146,161 | 9/1992 | Kiser | 371/22.1 |

FOREIGN PATENT DOCUMENTS 54-99570 8/1979 Japan.

OTHER PUBLICATIONS

Maly, Nag and Nigh, "Testing Oriented Analysis of CMOS Ics with Opens", Proceedings of the IEEE Internat'l. Conference on Computer-Aided Design, pp. 344–347, Nov. 1988.

Kundu and Reddy, "On the Design of Robust Testable CMOS Combinational Logic Circuits", IEEE, pp. 220–225, 1988.

Maly, "Realistic Fault Modeling for VLSI Testing," IEEE Design Automation Conference, pp. 173–180, 1987.

Liu and McCluskey, "Designing CMOS Circuits for Switch Level Testability", IEEE Transactions on Design & Test, pp. 42–49, 1987.

Reddy and Reddy, "Testable Realizations for FET Stuck-Open Faults in CMOS Combinational Logic Circuits", IEEE Transactions on Computers, pp. 742–754, Aug., 1986.

Shen, Maly and Ferguson, "Inductive Fault Analysis of MOS Integrated Circuits", IEEE Transactions on Design & Test, pp. 13–26, Dec., 1985.

Jha and Abraham, "Design of Testable CMOS Logic Circuits Under Arbitrary Delays," IEEE Transactions on Computer-Aided Design, pp. 264–269, Jul., 1985.

Reddy, Reddy and Agrawal, "Transistor Level Test Generation for MOS Circuits", IEEE Proceedings of 22nd Design Automation Conference, pp. 825–828, 1985.

(List continued on next page.)

Primary Examiner—Emanuel T. Voeltz
Assistant Examiner—Craig Miller
Attorney, Agent, or Firm—Bell, Seltzer, Park & Gibson

[57] ABSTRACT

An integrated logic circuit according to the present invention includes a plurality of logic circuit elements, such as field effect transistors, for performing a combinational logic function, and at least one test controlled-impedance element for loading the logic circuit and causing a first digital output signal to be produced when the impedance of a logic circuit element under test is within a predetermined range and produce another digital output signal when the impedance of the logic circuit element under test is outside the predetermined range. The test controlled-impedance elements typically comprise field effect transistors and are sized in accordance with a series of constraints. The constraints are obtained by considering the operation of the circuit under various impedance fault conditions (high, low and intermediate) and deriving a series of size relationships between the impedance values of the logic circuit and test elements. The impedance faults capable of being detected include the conventional stuck-on (LIF) arid stuck-off (HIF) impedance faults and also intermediate impedance faults (IHIF, ILIF) caused by a too high or too low an impedance in a transistor's on- and off-state modes of operation, respectively.

22 Claims, 4 Drawing Sheets

OTHER PUBLICATIONS

Reddy, Reddy and Kuhl, "On Testable Design for CMOS Logic Circuits", Proceedings of the Internat'l. Test Conference, pp. 434–445, 1983.

Chiang and Vranesic, "On Fault Detection in CMOS Logic Networks", IEEE Proceedings of 20th Design Automation Conference, pp. 50–55, 1983.

Malaiya and Su, "A New Fault Model and Testing Technique for CMOS Devices", IEEE Proceedings of the Internat'l. Test Conference, pp. 25–34, 1982.

Wadsack, "Fault Modeling and Logic Simulation of CMOS and MOS Integrated Circuits," The Bell System Technical Journal, pp. 1449–1473, May–Jun., 1978.

Rajsuman, Malaiya and Jayasumana, "CMOS-Stuck-Open Testability", IEEE Journal of Solid-State Circuits, pp. 193–194, Feb., 1989.

INTEGRATED LOGIC CIRCUIT INCLUDING IMPEDANCE FAULT DETECTION

FIELD OF THE INVENTION

The present invention relates to integrated logic circuits, and more particularly to fault testing of integrated logic circuits.

BACKGROUND OF THE INVENTION

The challenge of fault testing integrated logic circuits is becoming more formidable as advanced submicron processes for integrated circuit fabrication are developed. As is well known to those having skill in the art, an integrated logic circuit is an integrated circuit including large numbers of interconnected logic gates for accomplishing a predetermined logic function. Increased gate-count, higher integration densities, decreased relative I/O capability, smaller feature size, higher speeds, higher performance and increased complexity all severely restrict the application of conventional fault testing techniques in integrated logic circuits.

Although numerous techniques for transistor level fault modeling have been developed over the past years, most have not been widely used in integrated circuits because they either require excessive integrated circuit real estate, are not comprehensive in their range of fault detection, and/or cannot be consistently applied to a variety of circuit topologies and gate families. For example, many classes of logic circuits such as those designed using Complementary Metal Oxide Semiconductor (CMOS) processes, possess certain unique failure modes that cannot be adequately detected by conventional stuck-at, stuck-on or stuck-off modeling techniques. This is because these conventional techniques only test for extremes in device failure and do not recognize analog, intermediate and other types of failures that can cause signal degradation and delay. These latter types of failures are especially prevalent in advanced CMOS processes where process-induced defects commonly give rise to complex faults that are significantly different from those testable by conventional fault modeling techniques. Typical process related faults and a methodology for testing are described in an article by W. Maly, entitled "Realistic Fault Modeling for VLSI Testing," *Design Automation Conference* (1987), pp. 173-180.

In an article by R. L. Wadsack, entitled "Fault Modeling and Logic Simulation of CMOS and MOS Integrated Circuits," *Bell System Technical Journal*, (May-June 1978), pp. 1449-1473, conventional stuck-off testing techniques were used to detect catastrophic device failures caused when MOS and CMOS logic devices remained nonconducting in the presence of an applied turn-on bias. This type of fault is also known in the literature as a "stuck-open" fault. The converse of this type of failure is the "stuck-on" fault caused when a logic device remains conducting in the presence of a turn-off bias. Stuck-on types of faults also present a special testing problem since many of them remain undetectable using standard testing models.

A "stuck-at" fault measured at the higher gate level can be either a stuck-on or stuck-off fault. As well understood by one skilled in the art, a gate is generally made up of numerous transistors and is typically designed to perform a unique boolean function such as binary signal inversion (a NOT gate) or the NAND or NOR boolean logic functions. In older logic families, stuck-at fault modeling techniques covered most failure mechanisms, however, modern logic families can exhibit failures which cannot be detected with conventional stuck-at models. Such families include those fabricated using state-of-the-art MESFET, CMOS and other IGFET and bipolar families.

In recent years, spot defect modeling techniques have been developed as potential alternatives to stuck-at testing of logic gates fabricated using state-of-the-art processes such as CMOS. Spot defect modeling includes the development of a fault model based on circuit extraction from process level models containing topological and other fabrication layer aberrations. However, this approach fails to include the effects caused by material anomalies in the devices themselves. Other techniques such as current monitoring, commonly referred to as IDDQ testing, have also been proposed but are limited by the use of on-chip measurement structures which makes at-speed testing difficult and at best can only provide indirect measurement of device anomalies.

Other circuit designs for fault testing have mostly included techniques requiring the addition of transistors or the modification of the network topology to include test structures. At-speed testing has generally been avoided and much work has only involved stuck-on and stuck-off fault models. For example, in an article by S. M. Reddy and M. K. Reddy, entitled "Testable Realizations for FET Stuck-Open Faults in CMOS Combinational Logic Circuits," *IEEE Transactions on Computers*, Vol. C-35, No. 8, (August 1986), pp. 742-754, it is shown that in a specific design using a single CMOS gate, single transistor stuck-open faults can be detected in the presence of arbitrary circuit delays. However, means for detecting intermediate faults wherein the transistor under test is neither stuck-on nor stuck-off is not disclosed.

Moreover, in an article by D. L. Liu and E. J. McCluskey, entitled "Designing CMOS Circuits for Switch Level Testability," *IEEE Design and Test of Computers*, (August 1987), pp. 42-49, a CMOS design for transistor level testability using a three pattern testing scheme to detect only stuck-on and stuck-off faults is described. Finally, in an article by S. Kundu and S. M. Reddy, entitled "On the Design of Robust Testable CMOS Combinational Logic Circuits," *Eighteenth International Symposium on Fault-Tolerant Computing*, Tokyo, Japan (June, 1988), pp. 220-225, a robust testing technique for detecting stuck-open faults and path delays is provided. The technique for detecting path delays is incapable of detecting intermediate faults in the transistors under test.

Patent protection has also been obtained for integrated circuits having means for detecting faulty transistors and, in particular, means for detecting "short channel" effects. For example, in U.S. Pat. No. 4,789,825, to Carelli et al., an integrated circuit having channel length indicator means is disclosed. The channel length indicator means includes a test transistor with a channel length substantially greater than that of the transistor under test. The purpose of the test transistor is to generate a reference voltage to which the output voltage of the transistor under test can be compared. An excessive difference in the respective voltages indicates the presence of short channel effects and gate independent operation. A signal flag is also generated to indicate the presence of the short channel. The disclosed integrated circuit does not, however, have means for detecting stuck-on, stuck-off, or intermediate faults in the transistor under test.

In summary, notwithstanding many attempts to provide complete fault detection at the transistor level, the various described stuck-at, delay fault, spot defect and IDDQ models only cover restricted subsets of the dominant failure mechanisms associated with modern integrated circuit technologies. Moreover, conventional fault detection techniques fail to detect many intermediate faults.

SUMMARY OF THE INVENTION

It is therefore an object of the present invention to provide an improved integrated logic circuit having the built-in capability of determining whether faults exist in one or more of the logic circuit elements.

It is another object of the present invention to provide an improved integrated logic circuit which is capable of detecting transistor level stuck-on, stuck-off and stuck-at faults in active logic elements.

It is still another object of the present invention to provide an integrated logic circuit which is capable of detecting intermediate faults in active logic elements.

These and other objects of the invention are provided by an integrated circuit comprising a plurality of logic circuit elements and at least one test element for electrically loading at least one of the logic circuit elements and producing a first digital output signal when the impedance of the logic circuit element under test is within an acceptable range and producing a second digital output signal when the impedance is unacceptable. The impedance of the logic circuit element under test is checked during both its conductive ("on") and nonconductive ("off") modes of operation by an appropriately sized test element connected to the output of the logic circuit. The test element is designed to have an on-state impedance within a range of values. This range is dependent on the acceptable impedance values for the logic circuit elements to be tested.

The impedance fault detection means of the present invention allows for the testing of conventional faults, such as stuck-at, stuck-on and stuck-off as well as the identification of faults of the intermediate type caused by a too high or too low device impedance. These latter types of intermediate faults are especially important in high performance integrated circuits because they can cause signal degradation which can result in intermittent or "soft" failures due to marginal delay and signal aberrations from noise and crosstalk. These failures can also make combinational circuits exhibit sequential behavior.

The logic circuit and test elements of the present invention preferably comprise input-controlled impedance elements such as field effect transistors having gate-controlled channels between the source and drain. For advanced integrated circuit designs, these field effect transistors are typically formed using state-of-the-art CMOS fabrication processes.

For logic circuits comprising both n-channel and p-channel transistors, it is preferable to use at least two test transistors for detecting a broad range of impedance faults. These test transistors include a pull-down test transistor electrically connected between the logic circuit output and a first reference signal line and a pull-up test transistor electrically connected between the output and a second reference signal line. The pull-down test transistor is designed to electrically load one or more of the pull-up logic circuit transistors under test and, the pull-up test transistor is designed to electrically load one or more of the pull-down logic circuit transistors under test. The pull-down test transistor can also be used to assist or augment the pull-down network and vice versa.

An embodiment of the integrated circuit according to the present invention includes a complementary inverter logic circuit having a p-channel pull-up transistor and an n-channel pull-down transistor for performing binary signal inversion of the logic circuit input signal. This embodiment further includes a pull-down test transistor electrically connected between the logic circuit output and a first reference signal line such as ground, and a pull-up test transistor electrically connected between the logic circuit output and a second reference signal line such as the power supply voltage $V_{DD}$. Other embodiments of the present invention include more complex combinational logic circuits having a plurality of p-channel transistors in a pull-up network and a plurality of n-channel transistors in a pull-down network to thereby perform the NAND and NOR and other combinational logic functions.

According to the present invention, four impedance threshold values are selected to define an unacceptable range of operation for each logic circuit transistor to be tested. Two of these values correspond to a high-impedance fault ("HIF") value, when the transistor under test is non-conducting in response to a turn-on input signal, and an intermediate high-impedance fault ("IHIF") value, when the transistor under test is conducting to a limited extent but the impedance of the transistor is too high for proper circuit operation. The two other impedance threshold values are the low-impedance fault ("LIF") value when the transistor under test remains conducting in response to a turn-off input signal, and an intermediate low-impedance fault ("ILIF") value, when the transistor under test is turned-off to a limited extent, but the impedance of the transistor is too low for proper circuit operation.

Based on these four impedance values for the logic circuit transistor under test, the respective test transistor is sized to have an impedance which electrically loads the logic circuit transistor and produces a first digital output signal when the impedance of the logic circuit transistor is within an acceptable range of values and produce a second digital output signal when the impedance is outside the acceptable range. For example, by sizing the on-impedance of the pull-down test transistor to be less than the IHIF value and greater than the on-impedance value of the pull-up logic circuit transistor, intermediate fault detection is achieved when an additional constraint is also met. The additional constraint sizes the impedance of the parallel combination of the ILIF value of the pull-down logic circuit transistor and the on-impedance of the pull-down test transistor be less than the rated on-impedance value of the pull-up logic circuit transistor. Similarly, the converse requirements are preferably met with respect to the sizing of the pull-up test transistor.

Under certain conditions, it may also be necessary to incorporate blocking transistors between one or more of the logic circuit transistors and a corresponding reference signal line in order to achieve complete impedance fault coverage. This is especially true when testing for low-impedance faults (LIF and ILIF) when the pull-down test transistor is being used to determine the presence of low impedance faults in the pull-up logic circuit transistor, as well as in the converse situation involving the pull-up test transistor and the pull-down logic circuit transistor, In more complex combinational logic circuits such as NAND and NOR, etc., the presence of faults in one or more of the pull-up or pull-down transistors can also be determined. For example, in a NAND gate, each of the parallel configured pull-up transistors can be independently checked to determine whether impedance faults exist. Moreover, the series connected pull-down transistors of the NAND gate can also be checked in a similar manner as a series group.

Accordingly, by using appropriately sized test transistors, intermediate and conventional impedance faults such as stuck-on and stuck-off can be detected in elements of a logic circuit.

DESCRIPTION OF PREFERRED EMBODIMENTS

The present invention will now be described more fully hereinafter with reference to the accompanying drawings, in which preferred embodiments of the invention are shown. This invention may, however, be embodied in different forms depending on the particular configuration of the logic circuit and/or controlled-impedance elements (CZE) used and should not be limited to the embodiments set forth herein. Rather, these embodiments are provided so that this disclosure will be thorough and complete, and will fully convey the scope of the invention to those skilled in the art. Like numbers refer to like elements throughout.

Figure 1:
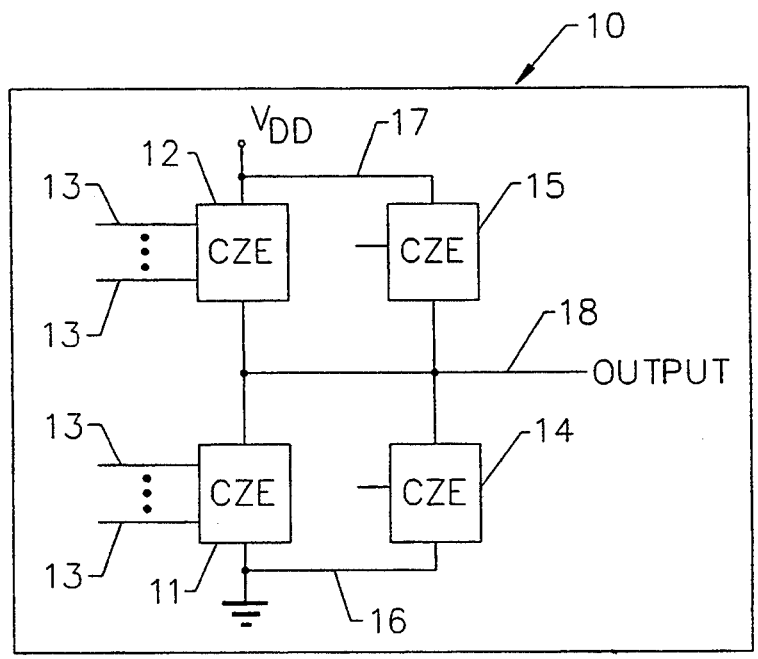
FIG. 1 illustrates an electrical schematic of an integrated logic circuit including impedance fault detection means according to the present invention.
Figure 2:
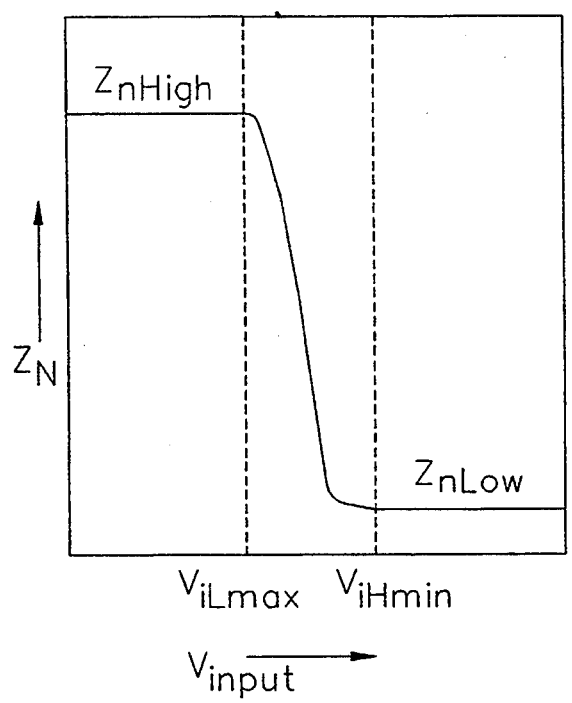
FIG. 2 graphically illustrates the impedance of an n-channel enhancement-mode field effect transistor as a function of gate input bias.

Referring now to FIG. 1, an integrated logic circuit including impedance fault detection according to the present invention will be described. The integrated circuit 10 is typically formed in a silicon, GaAs or other suitable substrate and includes a plurality of first logic circuit controlled-impedance elements 11 and a plurality of second logic circuit controlled-impedance elements 12 electrically connected to a plurality of logic input signal lines 13. As used herein, the term "controlled-impedance element" refers to an electrical element, such as a bipolar or field effect transistor, which has one or more input terminals and two or more output terminals, and in which an impedance between two of the output terminals is controlled by one or more input signals applied to the input terminals. For example, as shown in FIG. 2, a graph of the impedance of an n-channel enhancement-mode field effect transistor as a function of gate input voltage is provided. As will be understood by one skilled in the art, the impedance of the transistor remains relatively constant at a high value ($Z_{nHigh}$) until an input voltage threshold value ($V_{iLmax}$) is exceeded, at which point it drops to a final turn-on value ($Z_{nLow}$) at voltages higher than $V_{iHmin}$. This final turn-on value represents the on-impedance of the transistor.

Figure 3:
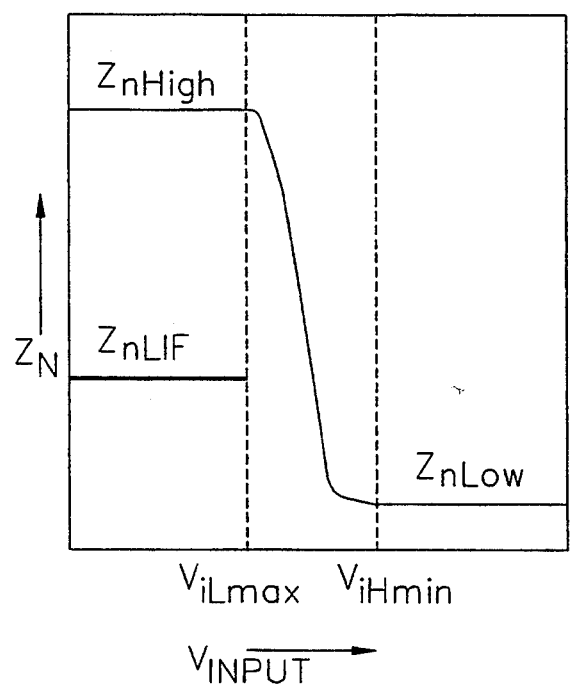
FIG. 3 graphically illustrates the impedance of an n-channel enhancement-mode field effect transistor as a function of gate input bias.
Figure 4:
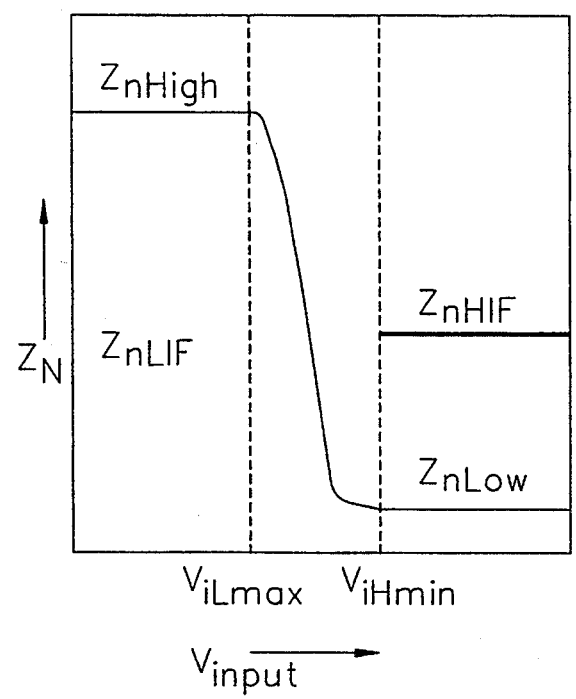
FIG. 4 graphically illustrates the impedance of an n-channel enhancement-mode field effect transistor as a function of gate input bias.

In the case of a low-impedance fault, the n-channel transistor will not turn-off when the input bias drops below $V_{iLmax}$. Alternatively, the presence of a high-impedance fault causes the impedance to remain high when the input bias exceeds $V_{iHmin}$. These cases are shown, respectively, by the graphs of FIGS. 3 and 4, wherein the low- and high-impedance values are depicted by a heavy line.

Figure 5:
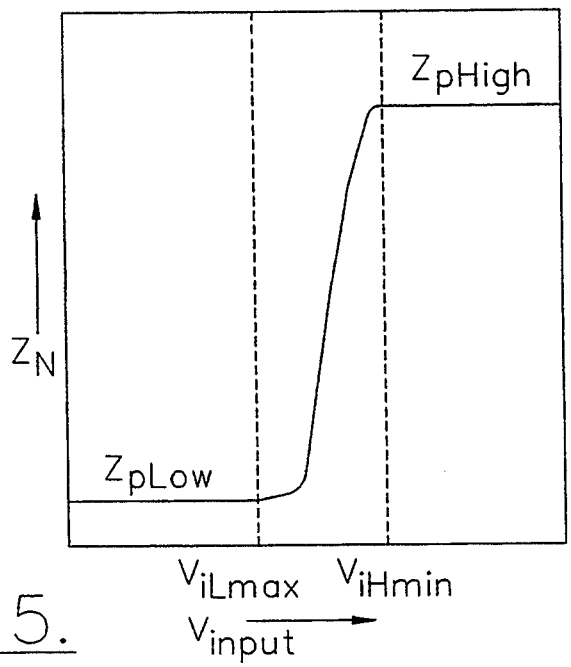
FIG. 5 graphically illustrates the impedance of an p-channel enhancement-mode field effect transistor as a function of gate input bias.

FIG. 5 represents an analogous graph of channel impedance versus input bias for a p-channel enhancement mode field effect transistor. Here, however, $Z_{pLow}$ represents the on-impedance of the transistor.

Referring again to FIG. 1, to provide impedance fault testing of the logic circuit elements, a first test controlled-impedance element 14 and a second test controlled-impedance element 15 are provided in parallel with the logic circuit controlled-impedance elements 11, 12. The logic circuit and test controlled-impedance elements are electrically, connected between a first reference signal line 16 and a second reference signal line 17 and to an output 18.

As is well known to those having skill in the art, depending on the configuration of the plurality of logic circuit controlled-impedance elements 11, 12, numerous different combinational logic functions can be performed. For example, if the controlled-impedance elements of 11 are electrically connected in series between the output 18 and the first reference signal line 16, and the controlled-impedance elements of 12 are electrically connected in parallel between the output 18 and second reference signal line 17, the NAND or OR combinational logic functions can be performed. Similarly, if the elements of 11 are electrically connected in parallel and the elements of 12 are electrically connected in series, the NOR or AND combinational logic functions can be performed.

Figures 6A, 6B:
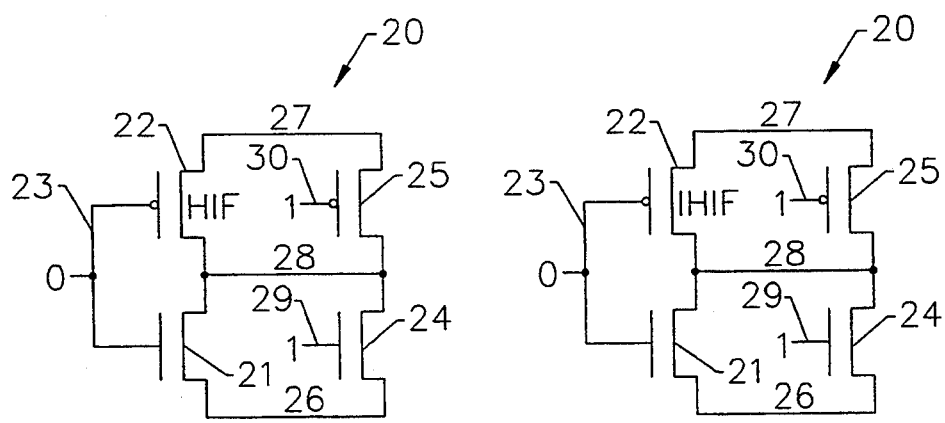
FIGS. 6A-6D illustrate an electrical schematic of an inverter comprised of enhancement-mode transistors including impedance fault detection means for detecting high impedance faults (HIF), intermediate high-impedance faults (IHIF), low impedance faults (LIF) and intermediate low-impedance faults (ILIF) in a pull-up logic circuit element.

Referring generally to FIGS. 6A-6D, the design of an integrated logic circuit including impedance fault detection will be described. The example logic circuit 20 is a symmetric inverter (a NOT gate) with an n-channel pull-down transistor 21 and a p-channel pull-up transistor 22. The inverter represents the simple case wherein the plurality of first logic circuit elements 11 and the plurality of second logic circuit elements 12, respectively, include single n-channel and p-channel field effect transistors, 21 and 22. However, the design described below can also be used for more complex combinational logic gates. The circuit further includes first (n-channel) and second (p-channel) test transistors 24, 25 and first and second reference signal lines 26, 27 and output 28. Four sets of input conditions are provided for determining whether impedance faults exist in the pull-up transistor 22. FIGS. 6A and 6B describe the input conditions applied to the circuit in testing for high and intermediate-high impedance faults. Similarly, FIGS. 6C and 6D describe the input conditions applied to the circuit in testing for low and intermediate-low impedance faults. From these four cases, a series of constraints can be derived for sizing the test transistors to thereby provide impedance fault coverage of the pull-up transistor 22 or in the analogous case, the pull-down transistor 21.

Referring now to FIG. 6A, the presence of a high impedance fault in the p-channel pull-up transistor 22 can be detected by initially applying a logic 0 signal to the logic circuit input 23. For a good circuit with no high impedance fault in transistor 22, the output 28 will be pulled up to about the voltage potential of the second reference signal line 27. Accordingly, the output 28 will be at a logic 1 value. However, if the first test transistor 24 is turned on, for example, by the application of a logic 1 signal at input terminal 29, the output 28 will remain at a logic 1 value for a good circuit and should fall to a logic 0 value if a high impedance fault is present in transistor 22. If a high impedance fault exists in transistor 22 and the first test transistor 24 is not turned on, the output will be in a high impedance state and will float at a value somewhere between the potentials of the reference signal lines 26, 27. Accordingly, the following impedance relationship should be met in order to detect high impedance faults with transistors 21 and 25 off:

$$Z_{22}(HIF) > Z_{24} > Z_{22} \qquad (1)$$

In Equation (1), $Z_{22}(HIF)$ denotes the impedance of the pull-up transistor 22 having a high-impedance fault, $Z_{24}$ denotes the on-impedance of the first test transistor 24, and $Z_{22}$ denotes the rated on-impedance of the pull-up transistor 22, without fault. As noted above, a high impedance fault will occur when the pull-up transistor 22 fails to turn on in response to a turn-on input signal at input 23, i.e., a logic 0 value. As will be understood by one skilled in the art, the impedances defined by the constraints of Equation (1), as well as the constraints provided below, should be sufficiently different to cause properly detectable output values when faults are present. The range of differences necessary for proper fault detection is a function of the characteristics of the impedance elements, the reference signal line potentials and the selected threshold values ($V_{iHmin}$, $V_{iLmax}$, etc.).

FIG. 6B represents the similar condition wherein an intermediate impedance fault is present in the pull-up transistor 22. Like the description with respect to FIG. 6A, the output 28 should be pulled to a logic 1 value if the p-channel pull-up transistor 22 is conducting and the first test transistor 24 is off. The output will also be pulled up to a logic 1 value when there is an intermediate high-impedance fault in the pull-up transistor 22, however, the rise-time of the output signal may be unduly long if the output is originally set to a logic 0 value. As will be understood by one skilled in the art, a sufficiently high intermediate impedance and fast test time may result in the logic circuit having sequential behavior during operation. Alternatively, the circuit 20 may exhibit correct behavior under certain limited input conditions and operating speeds and incorrect behavior at other times. Using an appropriately sized test transistor, however, an intermediate high-impedance fault will be detected by turning the first test transistor 24 on, thus pulling the output to a logic 0 value. This value is the opposite of the logic 1 value that would have occurred in a fault-free circuit.

The definition of what constitutes an intermediate impedance fault depends on circuit design constraints such as those relating to timing (gate delays) and speed and includes a range of unacceptable values. The range of unacceptable values extends between the extreme high impedance condition Z(HIF), when the transistor remains off in response to a turn-on signal, and a lowermost value Z(IHIF) when the transistor is conducting to some extent but the channel impedance is too high for proper circuit operation under all conditions. The lowermost value is generally chosen by a circuit designer based on $V_{iLmax}$ for the next subsequent logic circuit, speed, timing, fan-in, fan-out, and other ground-rule requirements of the particular logic circuit. Accordingly, the following impedance relationship must be met if intermediate high-impedance failures are to be detected:

$$Z_{22}(IHIF) > Z_{24} > Z_{22} \qquad (2)$$

In Equation (2), $Z_{22}(IHIF)$ denotes the impedance of the pull-up transistor 22 having a minimum intermediate high-impedance fault value, i.e., $Z_{22}(IHIF)$ defines the threshold high impedance fault value to be detected by the circuit. Equation 2 is identical to Equation 1 except the uppermost bound for the on-impedance of the first test transistor 24 is now $Z_{22}(IHIF)$ instead of $Z_{22}(HIF)$.

Figures 6C, 6D:
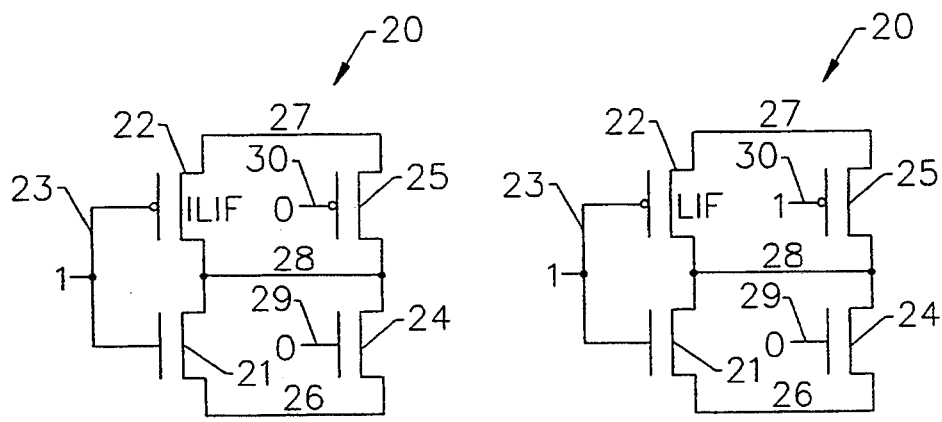

FIG. 6C shows the circuit 20 with inputs for detecting an intermediate low-impedance fault in the pull-up transistor 22. For a good circuit with no impedance faults and with the first and second test transistors 24, 25 turned off, the output 28 should be pulled to a logic 0 value when the pull-down transistor 21 is turned on by a logic 1 input signal. If the second test transistor 25 is then turned on by the application of a logic 0 test input signal, the output should still be held at a logic 0 value. However, if an intermediate low-impedance fault is present in transistor 22, the output will be pulled to an intermediate logic value somewhere between the potentials of the first and second reference signal lines, 26, 27. The actual intermediate value depends on the relative magnitude on the on-impedance of the pull-down transistor 21 and the intermediate low-impedance of the pull-up transistor 22. Using proper constraints on size, an intermediate low-impedance fault can be detected by turning on the second test transistor 25 so that the combined parallel impedance of the second test transistor 25 and pull-up transistor 22 will be low enough to pull up the output 28 to a logic 1 value. Accordingly, the following constraint is satisfied for detecting intermediate low-impedance faults:

$$Z_{25} > Z_{21} > [Z_{25} || Z_{22}(ILIF)] \qquad (3)$$

In Equation (3), $Z_{25}$ and $Z_{21}$ denote the on-impedance values of the second test transistor 25 and pull-down logic circuit transistor 21, respectively. The term $Z_{25} || Z_{22}(ILIF)$ denotes the parallel combination of the on-impedance of the second pull-up test transistor with the threshold impedance value of the intermediate low-impedance fault (i.e., the maximum impedance value constituting an ILIF).

For detecting low impedance faults as shown in FIG. 6D, no test transistors are needed since the output will be pulled to a detectable logic 1 value even when the pull-down transistor 21 is on.

A similar set of equations can be developed for checking whether impedance faults exist in the pull-down logic circuit transistor 21. These equations are analogous to Equations (1)–(3) except with, the pull-up and pull-down designations interchanged:

$$Z_{21}(HIF) > Z_{25} > Z_{21} \quad (4)$$

$$Z_{21}(IHIF) > Z_{25} > Z_{21} \quad (5)$$

$$Z_{24} > Z_{22} > [Z_{24} || Z_{21}(ILIF)] \quad (6)$$

By combining the constraints of Equations (3) and (5), and (2) and (6), respectively, the following generalized constraint equations for sizing the test transistors can be realized:

$$Z_{21}(IHIF) > Z_{25} > Z_{21} > [Z_{25} || Z_{22}(ILIF)] \quad (7)$$

$$Z_{22}(IHIF) > Z_{24} > Z_{22} > [Z_{24} || Z_{21}(ILIF)] \quad (8)$$

Accordingly, based on Equations (7) and (8), the impedance of each test transistor is bounded at the high end and low end by constraints. At the high end, the on-impedance of each test transistor 24, 25 is lower than the intermediate high-impedance fault value (i.e., the lowermost value constituting an IHIF) for the opposite logic circuit transistor 22, 21. Moreover, the on-state impedances of the test transistors 24, 25 are also greater than the on-state impedances of the opposite logic circuit transistors 22, 21, without fault. These latter impedance values $Z_{22}$, $Z_{21}$, should also be greater than the impedance of the opposite test transistors $Z_{24}$, $Z_{25}$ in parallel with the intermediate low-impedance values for the opposite logic circuit transistors $Z_{21}(ILIF)$, $Z_{22}(ILIF)$. This parallel combination represents the low end constraint.

Although the sizing of the each test transistor is independent of the value of the other test transistor, as shown by Equations (7) and (8), the first test transistor 24 is sized so that the output 28 reaches at least the minimum output potential for a logic 1 binary signal ($V_{iHmin}$) when no fault is present. The second transistor 25 is also sized so the output 28 does not exceed the maximum output potential for a logic 0 binary signal ($V_{iLmax}$) when no fault is present. These conditions produce a first digital output signal when the impedance of the logic circuit element under test is within a predetermined range and produce a second digital output signal, opposite the first digital output signal, when the impedance of the logic circuit element under test is outside the predetermined range.

Figure 7:
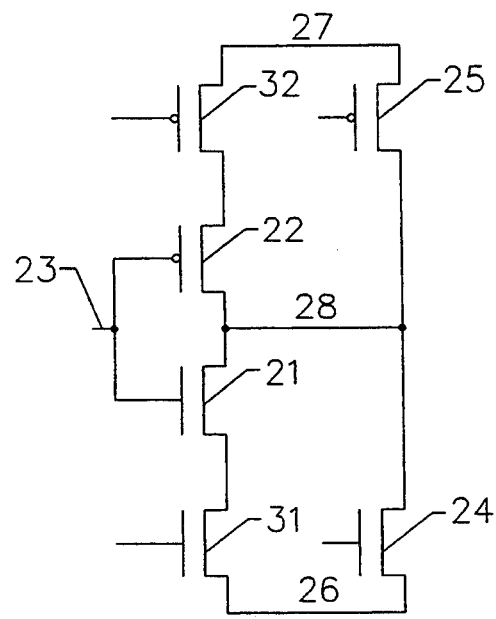
FIG. 7 illustrates an electrical schematic of the inverter of FIGS. 6A-6D with additional blocking transistors for electrically disconnecting the logic circuit transistors from their respective reference signal lines during testing.

The range of impedance fault coverage can also be extended by using the test transistors 24, 25 to detect intermediate low-impedance faults instead of the logic circuit transistors, as described with respect to FIGS. 6C and 6D, above. Accordingly, instead of using the logic circuit pull-down transistor 21 to check for ILIF faults, the pull-down test transistor 24 can be used if detection of higher threshold ILIF values is sought. As will be understood by one skilled in the art, the higher on-impedance of the test transistors 24, 25 as compared to the adjacent logic circuit transistors 21, 22 provides for a greater range of impedance fault coverage. In order to use the test transistors, each of the logic circuit transistors 21, 22 is disconnected from its respective power rails. As shown in FIG. 7, blocking controlled-impedance elements, such as transistors 31, 32 can be used to shut-off the pull-down or pull-up paths while intermediate low-impedance faults are checked with the test transistors 24, 25.

Moreover, if it becomes desirable to test for impedance faults in the test elements themselves, separate reference signal lines can be connected to the pull-down and pull-up test transistors. Preferably, these separate reference signal lines are adjustable so that a detectable error at the output will occur if either test transistor has a too low impedance in the off-state. This can be achieved by lowering or raising the potential of the reference signal line connected to the pull-down or pull-up transistor, respectively, to a predetermined value to thereby cause the output voltage to switch to a detectable fault value. For example, if the output was pulled to a logic 1 value in response to the turn-on of one or more of the pull-up logic circuit elements, a low impedance fault in the pull-down test transistor will not be detected if the impedance of the faulty pull-down test transistor is greater than the impedance of the turned-on pull-up logic circuit element. However, if the potential of the reference signal line connected to the pull-down test transistor is lowered to a predetermined value and the output switches from a logic 1 value to a logic 0 value, a low impedance fault in the pull-down test transistor will be detected. Had a low impedance fault not been present in the pull-down test transistor, the lowering of the potential on the reference signal line would have had little effect on the output since no appreciable conduction would occur therebetween.

Figure 8:
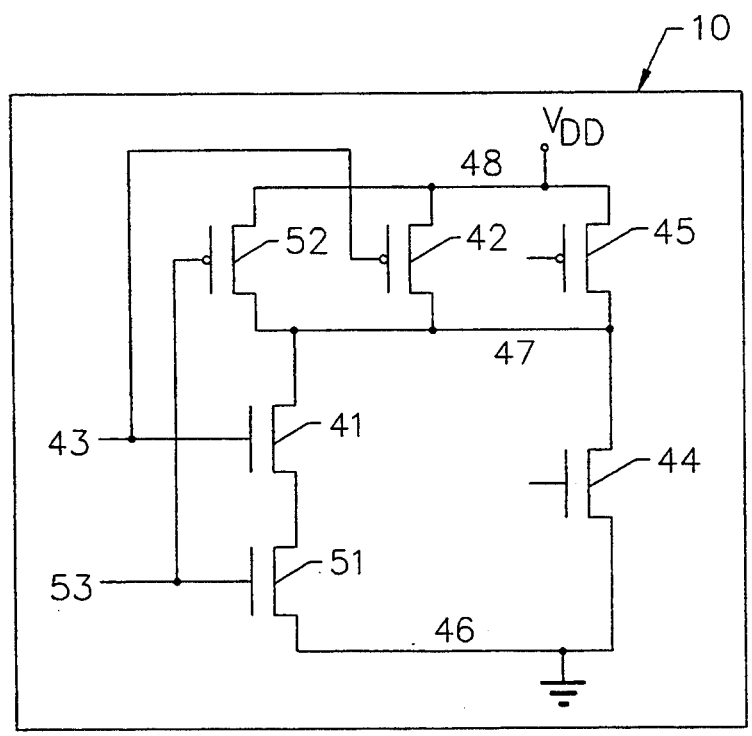
FIG. 8 illustrates an electrical schematic of a two-input NAND gate according to the present invention.

Impedance fault detection in accordance with the present invention can also be extended to integrated circuits 10 having more complex combinational logic circuits such as the two-input NAND gate shown in FIG. 8. The gate includes inputs 43, 53; pull-down logic circuit transistors 41, 51; pull-up logic circuit transistors 42, 52; reference signal lines 46, 48; output 47; and first and second test transistors 44, 45, respectively. Using similar techniques to those described with respect to FIGS. 6A–6D, impedance fault detection can be performed. For example, each pull-up transistor 42, 52, can be separately checked to determine whether HIF or IHIF faults are present by turning on the transistor to be checked and turning off the other. If a high-impedance fault is present, the output 47 will be pulled down to a logic 0 value by test transistor 44 instead of being pulled up to a logic 1 value. For detecting low-impedance faults, both transistors 42, 52 are checked by simultaneously providing a logic 1 input signal to each. As will be understood by one skilled in the art, it is not necessary to determine which of the pair of transistors is faulty since a low-impedance fault in either transistor will cause the output 47 to be pulled up to a logic 1 value. In the case of the series connected pull-down logic circuit transistors 41, 51, high-impedance faults are detected by applying a logic 1 input to both transistors and determining whether a logic 1 value at the output 47 is present. If a logic 1 is present, a HIF or IHIF fault is present in either transistor 41 or 51, or both. Again, it is unnecessary to determine which of the two transistors is faulty since a fault in either will prevent output 47 from being pulled to a logic 0 value when the inputs 43, 53 are logic 1 values.

Accordingly, once the intermediate low- and intermediate high-impedance fault threshold values have been determined for the logic elements of an integrated circuit, the test transistors are sized to electrically load the logic circuit and produce a correct output signal when no impedance faults are present in the element under test, and produce an incorrect output signal when impedance faults are present. The fault detection circuit is not limited to checking for stuck-on and stuck-off faults alone since a broad range of intermediate faults can be detected. These latter types of faults can give rise to complete circuit failure, but typically cause timing delays and signal aberrations that cannot otherwise be checked with conventional models but are nonetheless critical to high-speed operation.

In the drawings and specification, there have been disclosed typical preferred embodiments of the invention and, although specific terms are employed, they are used in a generic and descriptive sense only and not for the purposes of limitation, the scope of the invention being set forth in the following claims.

That which is claimed:

1. An integrated logic circuit comprising:
   a logic circuit having a plurality of logic circuit controlled-impedance elements and at least one input and an output, said output being in one of two binary states as a function of the binary value of said at least one input; and
   at least one test controlled-impedance element electrically connected to said logic circuit, said at least one test controlled-impedance element having an impedance which electrically loads said logic circuit to produce a first digital output signal when the impedance of at least one of said plurality of logic circuit controlled-impedance elements is within a predetermined range and produce a second digital output signal when said impedance is outside said predetermined range.

2. The integrated circuit of claim 1, wherein said plurality of logic circuit controlled-impedance elements comprises a first plurality of logic circuit controlled-impedance elements electrically connected between said output and a first reference signal line and a second plurality of logic circuit controlled-impedance elements electrically connected between said output and a second reference signal line.

3. The integrated circuit of claim 2, wherein said logic circuit is selected from the group consisting of NAND, NOR, AND, OR and NOT logic circuits.

4. The integrated circuit of claim 2, wherein said at least one test controlled-impedance element comprises a first test controlled-impedance element electrically connected between said output and the first reference signal line and a second test controlled-impedance element electrically connected between said output and the second reference signal line.

5. The integrated circuit of claim 4, wherein said first and second logic circuit controlled-impedance elements and said first and second test controlled-impedance elements comprise field effect transistors.

6. The integrated circuit of claim 4, wherein the impedance of said first test controlled-impedance element is less than the intermediate high-impedance threshold value of one of said second logic circuit controlled-impedance elements and is also greater than the impedance of said one of said second logic circuit controlled-impedance elements, and the impedance of the parallel combination of said first test controlled-impedance element and the intermediate low-impedance threshold value of one of said first logic circuit controlled-impedance elements is less than the impedance of said one of said second logic circuit controlled-impedance elements.

7. The integrated circuit of claim 6, wherein the impedance of said second test controlled-impedance element is less than the intermediate high-impedance threshold value of said one of said first logic circuit controlled-impedance elements and is also greater than the impedance of said one of said first logic circuit controlled-impedance elements, and the impedance of the parallel combination of said second test controlled-impedance element and the intermediate low-impedance threshold value of said one of said second logic circuit controlled-impedance elements is less than the impedance of said one of said first logic circuit controlled-impedance elements.

8. The integrated circuit of claim 7, further comprising
   a first current blocking means, electrically connected between the first reference signal line and said one of said first logic circuit controlled-impedance elements, for suppressing electrical conduction in said one of said first logic circuit controlled-impedance elements in response to a first blocking signal; and
   a second current blocking means, electrically connected between the second reference signal line and said one of said second logic circuit controlled-impedance elements, for suppressing electrical conduction in said one of said second logic circuit controlled-impedance elements in response to a second blocking signal.

9. An integrated logic circuit comprising:
   a logic circuit having a first and second plurality of logic circuit controlled-impedance elements and an output, each of said first and second plurality of logic circuit controlled-impedance elements having an input electrically connected to one or more input signal lines for receiving input signals thereon, said output being in a predetermined one of two binary states as a function of the binary value of at least one of the input signals;
   a first test controlled-impedance element electrically connected between said output and a first reference signal line, said first test controlled-impedance element having an impedance which electrically loads one of said second logic circuit controlled-impedance elements to produce a first binary output signal when the impedance of said one of said second logic circuit controlled-impedance elements is within a first predetermined range, and produce a second binary output signal when the impedance of said one of said second logic circuit controlled-impedance elements is outside said first predetermined range; and
   a second test controlled-impedance element electrically connected between a second reference signal line and said output, said second test controlled-impedance element having an impedance which electrically loads one of said first logic circuit controlled-impedance elements to produce said second binary output signal when the impedance of said one of said first logic circuit controlled-impedance elements is within a second predetermined range and produce said first binary output signal when the impedance of said one of said first logic circuit controlled-impedance elements is outside said second predetermined range.

10. The integrated circuit of claim 9, wherein the impedance of said first test controlled-impedance element is less than the intermediate high-impedance threshold value of said one of said second logic circuit controlled-impedance elements and is also greater than the impedance of said one of said second logic circuit controlled-impedance elements, and the impedance of the parallel combination of said first test controlled-impedance element and the intermediate low-impedance threshold value of said one of said first logic circuit controlled-impedance elements is less than the impedance of said one of said second logic circuit controlled-impedance elements.

11. The integrated circuit of claim 10, wherein the impedance of said second test controlled-impedance element is less than the intermediate high-impedance threshold value of said one of said first logic circuit controlled-impedance elements and is also greater than the impedance of said one of said first logic circuit controlled-impedance elements, and the impedance of the parallel combination of said second test controlled-impedance element and the intermediate low-impedance threshold value of said one of said second logic circuit controlled-impedance elements is less than the impedance of said one of said first logic circuit controlled-impedance elements.

12. The integrated circuit of claim 9, further comprising a first current blocking means, electrically connected between the first reference signal line and said one of said first logic circuit controlled-impedance elements, for suppressing electrical conduction in said one of said first logic circuit controlled-impedance elements in response to a first blocking signal; and a second current blocking means, electrically connected between the second reference signal line and said one of said second logic circuit controlled-impedance elements, for suppressing electrical conduction in said one of said second logic circuit controlled-impedance elements in response to a second blocking signal.

13. The integrated circuit of claim 12, wherein said first and said second current blocking means comprise controlled-impedance elements.

14. The integrated circuit of claim 12, wherein said first logic circuit controlled-impedance elements and said first test controlled-impedance element respectively comprise logic circuit and test field effect transistors of first channel-type, and wherein said second logic circuit controlled-impedance elements and said second test controlled-impedance element respectively comprise logic circuit and test field effect transistors of second channel-type.

15. The integrated circuit of claim 14, wherein said first and said second current blocking means comprise field effect transistors.

16. An integrated circuit comprising:

a logic circuit having a plurality of logic circuit controlled-impedance elements and an output, each of said plurality of logic circuit controlled-impedance elements having an input electrically connected to one or more input signal lines for receiving input signals thereon, said output being in a predetermined one of two binary states as a function of the value of at least one of said input signals;

at least one blocking controlled-impedance element electrically connected to at least one of said plurality of logic circuit controlled-impedance elements, a reference signal line and a blocking input, said blocking controlled-impedance element providing an electrical connection between said reference signal line and said at least one of said plurality of logic circuit controlled-impedance elements, in response to a selected binary signal at said blocking input; and at least one test controlled-impedance element electrically connected to said output, said at least one test controlled-impedance element having an impedance which electrically loads said logic circuit to produce the predetermined one of two binary states when the impedance of said at least one of said plurality of logic circuit controlled-impedance elements is within a predetermined range and produce the other of said one of two binary states when said impedance is outside said predetermined range.

17. The integrated circuit of claim 16, wherein said plurality of logic circuit controlled-impedance elements comprises a first plurality of logic circuit controlled-impedance elements electrically connected between said output and a first reference signal line and a second plurality of logic circuit controlled-impedance elements electrically connected between said output and a second reference signal line.

18. The integrated circuit of claim 17, wherein said logic circuit is selected from the group consisting of NAND, NOR, AND, and OR logic circuits.

19. The integrated circuit of claim 17, wherein said at least one test controlled-impedance element comprises a first test controlled-impedance element electrically connected between said output and the first reference signal line and a second test controlled-impedance element electrically connected between said output and the second reference signal line.

20. The integrated circuit of claim 19, wherein said first and second logic circuit controlled-impedance elements and said first and second test controlled-impedance elements comprise field effect transistors.

21. The integrated circuit of claim 19, wherein the impedance of said first test controlled-impedance element is less than the intermediate high-impedance threshold value of one of said second logic circuit controlled-impedance elements and is also greater than the impedance of said one of said second logic circuit controlled-impedance elements, and the impedance of the parallel combination of said first test controlled-impedance element and the intermediate low-impedance threshold value of one of said first logic circuit controlled-impedance elements is less than the impedance of said one of said second logic circuit controlled-impedance elements.

22. The integrated circuit of claim 21, wherein the impedance of said second test controlled-impedance element is less than the intermediate high-impedance threshold value of said one of said first logic circuit controlled-impedance elements and is also greater than the impedance of said one of said first logic circuit controlled-impedance elements, and the impedance of the parallel combination of said second test controlled-impedance element and the intermediate low-impedance threshold value of said one of said second logic circuit controlled-impedance elements is less than the impedance of said one of said first logic circuit controlled-impedance elements.

* * * * *